(12) United States Patent
Hori et al.

(10) Patent No.: US 9,438,201 B2
(45) Date of Patent: Sep. 6, 2016

(54) COMPOSITE SUBSTRATES FOR ACOUSTIC WAVE ELEMENTS, AND ACOUSTIC WAVE ELEMENTS

(71) Applicant: NGK INSULATORS, LTD., Aichi-prefecture (JP)

(72) Inventors: Yuji Hori, Owariasahi (JP); Tomoyoshi Tai, Inazawa (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 14/835,938

(22) Filed: Aug. 26, 2015

(65) Prior Publication Data

US 2015/0365067 A1 Dec. 17, 2015

Related U.S. Application Data

(63) Continuation of application No. PCT/JP2014/058705, filed on Mar. 19, 2014.

(30) Foreign Application Priority Data

Mar. 21, 2013 (JP) ................................. 2013-058925

(51) Int. Cl.
*H03H 9/64* (2006.01)
*H03H 9/02* (2006.01)
*H03H 9/25* (2006.01)

(52) U.S. Cl.
CPC ..... *H03H 9/02834* (2013.01); *H03H 9/02228* (2013.01); *H03H 9/02574* (2013.01); *H03H 9/25* (2013.01); *H03H 9/6489* (2013.01)

(58) Field of Classification Search
CPC ...................... H03H 9/02015; H03H 9/02047; H03H 9/02102; H03H 9/02133; H03H 9/02228; H03H 9/02559; H03H 9/02574; H03H 9/02614; H03H 9/02834; H03H 9/02897; H03H 9/0509; H03H 9/0585; H03H 9/0595; H03H 9/64; H03H 9/25; H03H 9/6489
USPC ......... 333/187, 193–195; 310/313 B, 313 D, 310/348
See application file for complete search history.

(56) References Cited

U.S. PATENT DOCUMENTS 5,815,900 A * 10/1998 Ichikawa ................. H03H 3/10
29/25.35
8,115,365 B2 2/2012 Suzuki et al.
(Continued)

FOREIGN PATENT DOCUMENTS

JP 5-335879 A 12/1993
JP 2001-332949 A 11/2001
(Continued)

OTHER PUBLICATIONS

International Search Report and Written Opinion for PCT Patent App. No. PCT/JP2014/058705 (Jun. 3, 2014) with English language translations of the Search Report and the relevant parts of the Opinion.

*Primary Examiner* — Barbara Summons
(74) *Attorney, Agent, or Firm* — Cermak Nakajima & McGowan LLP; Tomoko Nakajima (57) ABSTRACT

A composite substrate for an acoustic wave element includes a support substrate 1 and a propagation substrate 3 for propagating an acoustic wave. The propagation substrate is bonded to the support substrate 1 and composed of a piezoelectric single crystal. The propagation substrate 3 includes a surface lattice distortion layer 11 in which crystal lattices of the piezoelectric single crystal are distorted.

12 Claims, 7 Drawing Sheets

(56) References Cited

U.S. PATENT DOCUMENTS

| | | | |
|---|---|---|---|
| 8,490,260 B1 * | 7/2013 | Zhgoon | H03H 9/02574 29/25.35 |
| 2007/0257580 A1 | 11/2007 | Chen et al. | |
| 2010/0182101 A1 * | 7/2010 | Suzuki | H03H 9/02015 333/193 |
| 2011/0278993 A1 * | 11/2011 | Iwamoto | H03H 3/02 310/345 |

FOREIGN PATENT DOCUMENTS

| | | |
|---|---|---|
| JP | 2009-536465 A | 10/2009 |
| JP | 2009-278610 A | 11/2009 |
| JP | 2010-153961 A | 7/2010 |
| JP | 2011-254354 A | 12/2011 |

* cited by examiner

COMPOSITE SUBSTRATES FOR ACOUSTIC WAVE ELEMENTS, AND ACOUSTIC WAVE ELEMENTS

TECHNICAL FIELD

The present invention relates to an acoustic wave element which is highly efficient and has satisfactory frequency temperature characteristics.

BACKGROUND ARTS

A surface acoustic wave (SAW) element is extensively used as a band pass filter for communication equipment such as a cellular phone. With the enhancement in performance of the cellular phone or the like, higher performance is required also in such a filter using the surface acoustic wave element.

However, the surface acoustic wave element has a problem in that its passband is shifted with temperature changes. Lithium niobate or lithium tantalate presently in heavy usage is particularly advantageous for achieving wideband filter characteristics due to its large electromechanical coupling coefficient. However, lithium niobate or lithium tantalate is inferior in temperature stability.

For example, the temperature coefficient of frequency change of a surface acoustic wave filter using lithium tantalate is −35 ppm/° C., and frequency variation in a possible operating temperature range is large. Therefore, the temperature coefficient of frequency change is required to be reduced.

In a surface acoustic wave element described in Patent Literature 1 (Japanese Patent Publication No. H05-335879A), the temperature coefficient of frequency is reduced by forming, after forming an interdigitated electrode on a surface of a lithium niobate substrate, a silicon oxide film so as to cover the substrate surface and the interdigitated electrode.

In a surface acoustic wave element described in Patent Literature 2 (Japanese Patent Publication No. 2009-278610A), the temperature coefficient of frequency change is successfully reduced, by adhering a support substrate, composed of silicon or the like having a smaller thermal expansion coefficient, to a propagation substrate composed of lithium tantalate single crystal or the like, through an organic adhesive layer having a thickness of 0.1 to 1.0 µm.

SUMMARY OF INVENTION

In the element described in Patent Literature 1 (Japanese Patent Publication No. H05-335879A), since the silicon oxide layer is formed on the surface of the lithium niobate substrate to cover the interdigitated electrode, the lithium niobate substrate is constrained by the silicon oxide layer when the temperature coefficient of frequency change is reduced, causing deterioration in propagation efficiency of surface acoustic wave, or deterioration of Q value in the case of surface acoustic wave filter.

In the element described in Patent Literature 2 (Japanese Patent Publication No. 2009-278610A), although the temperature coefficient of frequency change can be reduced. However, it is necessary to reduce the thickness of the propagation substrate composed of, for example, lithium tantalate too much to reduce the temperature coefficient close to zero. However, when the propagation substrate is thinned, the reflection of bulk waves at the joint interface is enhanced just for that, facilitating generation of unnecessary spurious-mode waves.

The present invention thus has an object to reduce the temperature coefficient of frequency change of an acoustic wave element.

A composite substrate for acoustic wave element according to the present invention comprises: a support substrate and a propagation substrate. The propagation substrate propagates an acoustic wave, is bonded to the support substrate and is composed of a piezoelectric single crystal. The propagation substrate has a surface lattice distortion layer in which the crystal lattices of the piezoelectric single crystal are distorted. The crystal lattice distorted layer has a thickness of 15 nm or smaller.

An acoustic wave element according to the present invention comprises: the above-mentioned composite substrate; and an electrode pattern provided on the propagation substrate.

Figure 5:
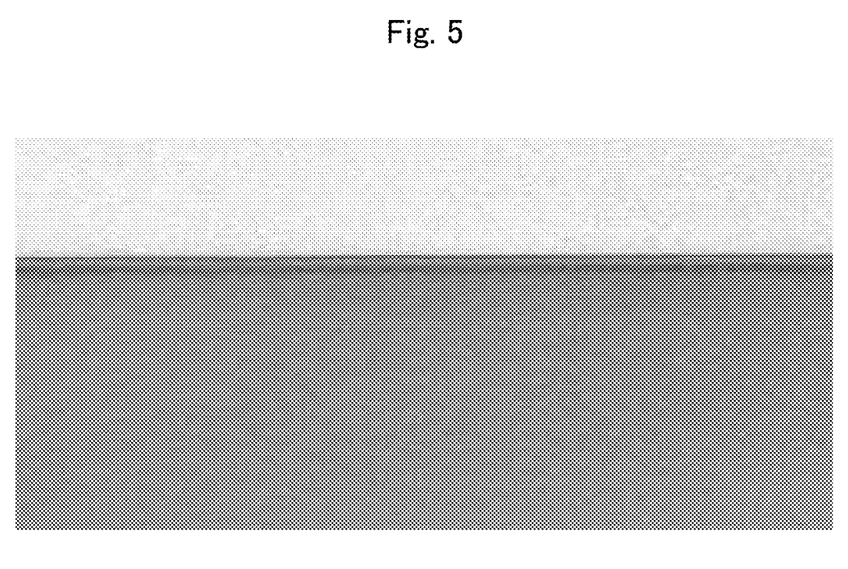
FIG. 5 is a transmission electron micrograph of the propagation substrate of the present invention.

The present inventors tried to form, on a surface of a propagation substrate composed of a piezoelectric single crystal, a lattice distortion layer in which the crystal lattices thereof are distorted. Namely, a contrast was observed in a high-resolution transmission electron microscope (TEM) image which was picked up with respect to a cross-section of the propagation substrate. More specifically, as shown in FIG. 5, a darker-appearing thin layer with contrast difference was identified in the vicinity of the surface of the propagation substrate.

Such a layer with contrast difference, which appears in a low-magnification TME image, is caused by either crystal lattice defect or lattice distortion. The present inventors then obtained an FFT (Fast Fourier Transform) pattern by subjecting the high-resolution TEM image to FFT. As a result, no spot caused by crystal defect was identified. Thus, it could be confirmed that the thin layer with the contrast difference, which appeared on the surface of the propagation substrate, was not a layer caused by crystal lattice defect but a layer having lattice distortion.

The thus-formed lattice distortion layer on the propagation substrate surface can effectively suppress the expansion and contraction resulting from temperature changes to reduce the temperature coefficient of frequency change, since it is harder than the piezoelectric single crystal constituting the whole body of the propagation substrate. Further, the surface lattice distortion layer exhibits an effect to confine elastic energy in the vicinity of the substrate surface, since the sound velocity is enhanced therein. This energy-confining effect is expected to improve the acoustic wave propagation efficiency.

BRIEF DESCRIPTION OF DRAWINGS

FIG. 1(a) corresponds to a cross-section taken along Ia-Ia in FIG. 1(b).

FIG. 2(a) corresponds to a cross-section taken along IIa-IIa in FIG. 2(b).

MODES FOR CARRYING OUT THE INVENTION (Example of Surface Acoustic Wave Element)

Figure 1A:
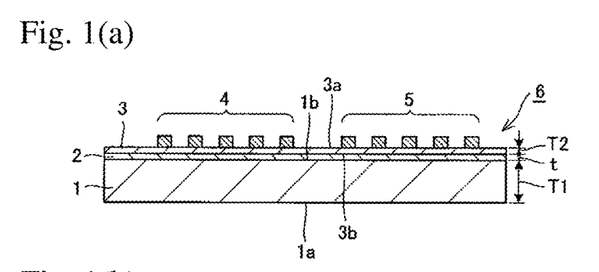
FIG. 1(a) is a cross-sectional view schematically showing a surface acoustic wave element 6.
Figure 1B:
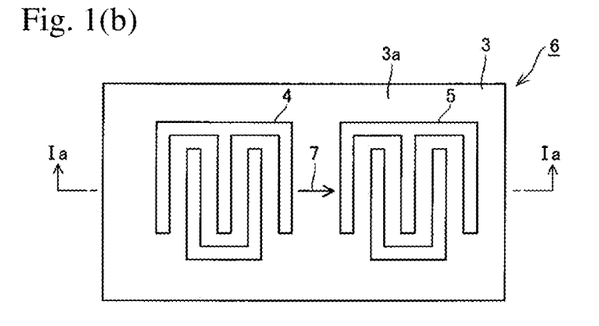
FIG. 1(b) is a top view schematically showing the element 6 of FIG. 1(a).

In a surface acoustic wave element 6 shown in FIGS. 1(a) and (b), a bonding face 3b of a propagation substrate 3 is bonded to a bonding face 1b of a support substrate 1 through an adhesive layer 2. Denoted at 1a is the bottom surface of the support substrate 1. An input electrode 4 and an output electrode 5 are formed on a surface 3a of the propagation substrate, whereby a transversal type surface acoustic wave element 6 is obtained. A surface acoustic wave is propagated from the input electrode 4 to the output electrode 5 as shown by arrow 7 to constitute a surface acoustic wave filter.

Figure 2A:
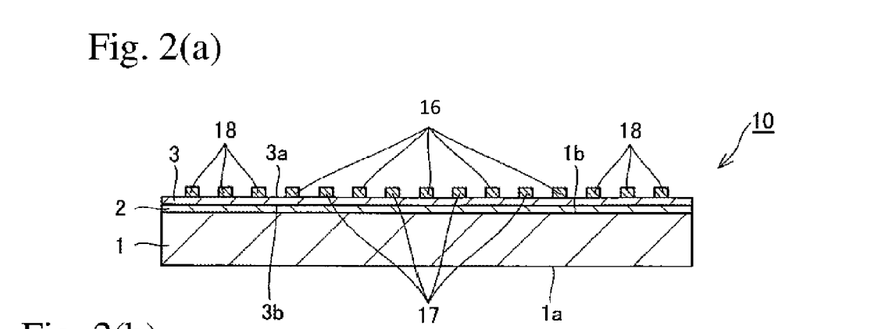
FIG. 2(a) is a cross-sectional view schematically showing another surface acoustic wave element 10.
Figure 2B:
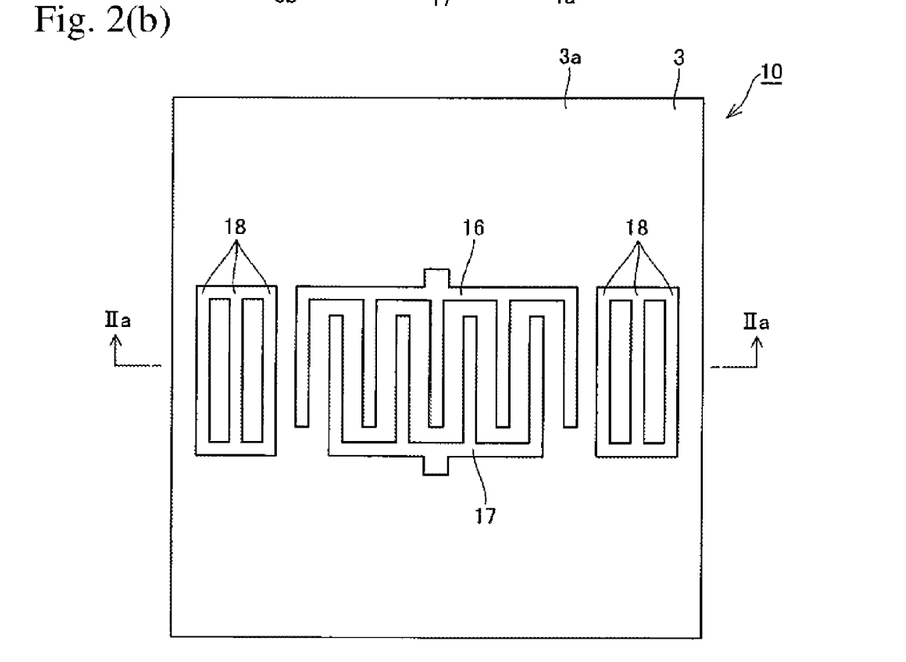
FIG. 2(b) is a top view schematically showing the element 10 of FIG. 2(a).

In a surface acoustic wave filter for cellular phone, a resonance surface acoustic wave element is mainly used. FIGS. 2(a) and (b) are related to an example of this element. FIG. 2(b) shows an example of electrode pattern in the resonance surface acoustic wave element.

In a surface acoustic wave element 10 of FIGS. 2(a) and (b), the bonding face 3b of the propagation substrate 3 is bonded to the bonding face 1b of the support substrate 1 through the adhesive layer 2. Denoted at 1a is the bottom surface of the support substrate 1. Electrodes 16, 17, 18 are formed on the surface 3a of the propagation substrate, whereby a resonance surface acoustic wave element is obtained.

Figure 3A:
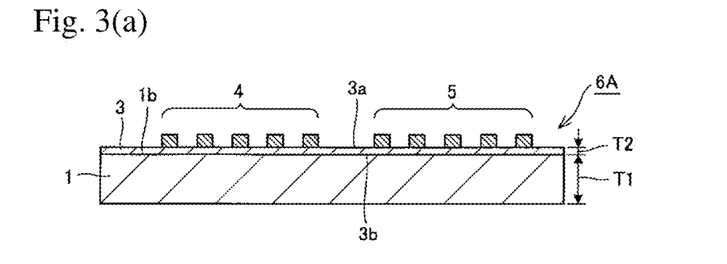
FIGS. 3(a) and (b) are cross-sectional views schematically showing other surface acoustic wave elements 6A, 10A respectively.

In a surface acoustic wave element 6A shown in FIG. 3(a), the bonding face 3b of the propagation substrate 3 is directly bonded to the bonding face 1b of the support substrate 1. The input electrode 4 and the output electrode 5 are formed on the surface 3a of the propagation substrate, whereby a transversal type surface acoustic wave element 6A is obtained. A surface acoustic wave is propagated from the input electrode 4 to the output electrode 5 to constitute a surface acoustic wave filter.

Figure 3B:
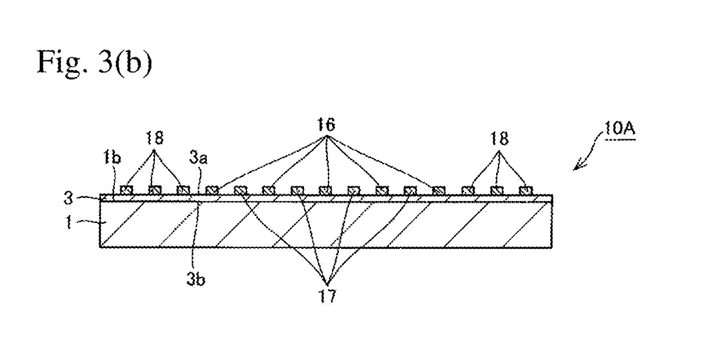

In a surface acoustic wave element 10A of FIG. 3(b), the bonding face 3b of the propagation substrate 3 is directly bonded to the bonding face 1b of the support substrate 1. Denoted at 1a is the bottom surface of the support substrate 1. Electrodes 16, 17, 18 are formed on the surface 3a of the propagation substrate, whereby a resonance type surface acoustic wave element is obtained.

(Surface Lattice Distortion Layer)

Figure 4:
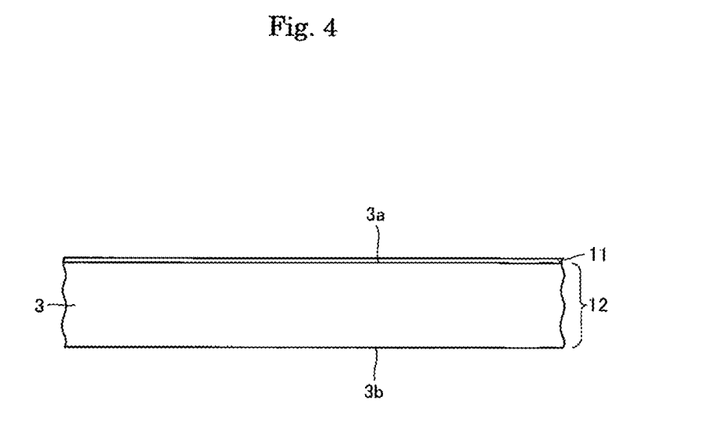
FIG. 4 is a schematic view showing a propagation substrate 3 of the present invention.

In the present invention, a surface lattice distortion layer 11 is formed on the surface 3a side of the propagation substrate 3 as shown in FIG. 4. Denoted at 12 is a layer having no particular lattice distortion.

When a high-resolution transmission electron microscope (TEM) image was picked up with respect to a transverse section of the propagation substrate 3, a contrast was observed on the surface in the TEM image as shown in FIG. 5. Such a high-resolution TEM image was subjected to fast Fourier transform (FFT) to obtain an FFT pattern. As a result, no spot caused by crystal defect was identified therein. Thus, it was confirmed that a thin layer with contrast difference appearing on the surface of the propagation substrate was not a layer caused by crystal lattice defect but a layer having lattice distortion.

The thickness of the lattice distortion layer present on the surface of the propagation substrate is preferably 15 nm or less and more preferably 10 nm or less and most preferably 8 nm or less, from the viewpoint of actual manufacturing. Further, the thickness of the lattice distortion layer present on the surface of the propagation substrate may preferably be 5 nm or smaller and more preferably 3 nm or smaller, on the viewpoint of propagation loss. Although the lower limit of the thickness of the lattice distortion layer present on the surface of the propagation substrate is not particularly limited, it may preferably be 1 nm or larger.

The thickness of the lattice distortion layer present on the surface of the propagation substrate means the thickness of a layered region. The layered region is present on the surface and its contrast is different from the crystal of the propagation substrate, in the above-mentioned TEM image with respect to the transverse section of the propagation substrate 3.

In the present invention, an electrode pattern as described above is formed on the surface lattice distortion layer. The lattice distortion layer on the propagation substrate surface can effectively suppress the expansion and contraction resulting from temperature changes to reduce the temperature coefficient of frequency change, since it is harder than the piezoelectric single crystal constituting the whole body of the propagation substrate. Further, the surface lattice distortion layer exhibits an effect to confine elastic energy in the vicinity of the substrate surface, since the sound velocity is enhanced therein. This energy-confining effect is expected to improve the acoustic wave propagation efficiency.

Each element of the present invention will be then described in more detail.

(Acoustic Wave Element)

The acoustic wave element of the present invention may be an element using Lamb wave propagating inside the propagation substrate, in addition to the surface acoustic wave. The acoustic wave element is particularly preferably a surface acoustic wave filter or a resonator. As the surface acoustic wave filter, a band pass filter is preferred, and as the resonator, a surface acoustic wave oscillating element is preferred, including both 1-port type and 2-port type.

The acoustic wave element may be a Lamb wave-type resonator, which comprises an IDT electrode having a plurality of interleaved electrode fingers, the electrode being provided on a surface of a propagation substrate; and a pair of reflectors disposed on both sides in a Lamb wave-propagating direction of the IDT electrode. Lamb wave is a plate wave obtained by propagating bulk wave inside the substrate while repeating reflections at the upper and lower surfaces of the substrate, by reducing the thickness of the substrate to several wavelengths or less of the wave to be propagated. Contrary to a surface wave having 90% of energy within the depth of one wavelength from the substrate surface, such as Rayleigh wave, leaky surface acoustic wave or pseudo longitudinal leaky surface acoustic wave, the energy is distributed through the entire substrate, since the Lamb wave is the bulk wave propagating inside the substrate.

(Support Substrate)

The material of the support substrate is preferably a material selected from the group consisting of silicon, sapphire, aluminum nitride, silicon carbide sintered body, silicon nitride sintered body, alumina, borosilicate glass and quartz glass. The support substrate is preferably composed of silicon or borosilicate glass, and particularly preferably composed of silicon. By adopting such materials, the thermal expansion of the propagation substrate can be minimized to further improve the frequency temperature characteristics.

It is preferred that no oxide film is formed on the surface of the support substrate. According to this, the adhesive force of the support substrate to the propagation substrate can be enhanced to prevent peeling of the support substrate from the propagation substrate or cracking thereof, even at a high temperature. From this point of view, it is preferred that the support substrate is composed of silicon and has no silicon oxide film on the surface. The presence or absence of the surface oxide film on the support substrate is determined through cross-section observation by transmission electron microscope (TEM).

The thickness T1 of the support substrate is preferably 100 μm or more, more preferably 150 μm or more, and most preferably 200 μm or more, from the point of improvement in temperature characteristics. Further, T1 is preferably 500 μm or less from the point of miniaturization of product.

(Propagation Substrate)

The material of the propagation substrate is preferably selected from the group consisting of single crystals of lithium niobate, lithium tantalate and lithium niobate-lithium tantalate solid solution having a large electromechanical coupling factor. Preferably, the piezoelectric single crystal is composed of lithium tantalate.

The propagation substrate preferably has a surface acoustic wave propagating direction of X direction and a rotary Y-cut cutting angle. Particularly preferably, the propagation substrate is a 35-130° Y-cut substrate in the case of lithium niobate, and a 36-47° Y-cut substrate in the case of lithium tantalate.

The thickness T2 of the propagation substrate is preferably 10 to 50 μm, more preferably 10 to 40 μm, and most preferably 10 to 30 μm, in the case of a surface acoustic wave device, from the point of improvement in the frequency temperature characteristics. In an acoustic wave device using Lamb wave or bulk acoustic wave, the thickness T2 of the propagation substrate is preferably 0.1 to 10 μm, and most preferably 0.1 to 1 μm.

(Electrode Pattern)

The material constituting the electrode pattern is preferably aluminum, aluminum alloy, copper or gold, and more preferably aluminum or aluminum alloy. As the aluminum alloy, a one including 0.3 to 5 wt. % of Cu mixed to Al is preferably used. In this case, Ti, Mg, Ni, Mo or Ta may be used instead of Cu.

The ratio (t/λ) of the thickness of the electrode pattern to acoustic wave wavelength λ is preferably 3 to 15%, more preferably 5% or more, and also is more preferably 15% or less.

(Example of Manufacturing Process)

Figure 6A:
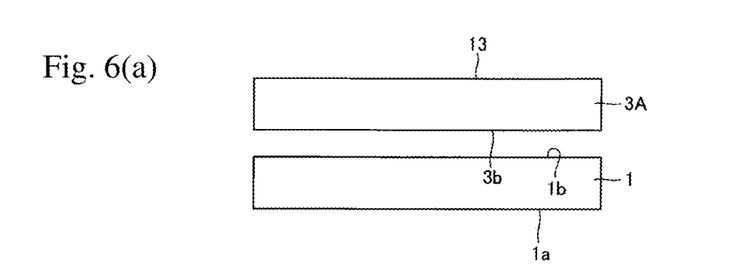
FIGS. 6(a), (b) and (c) are views for illustrating a process for manufacturing the element of the present invention.
Figure 6B:
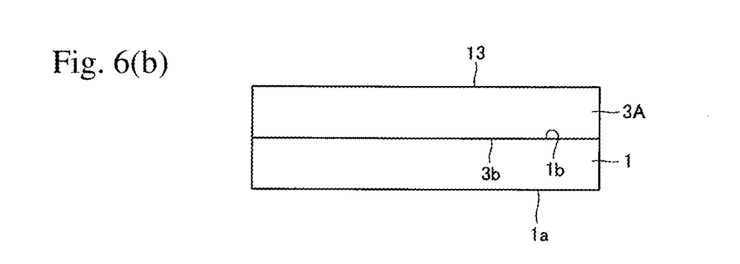
Figure 6C:
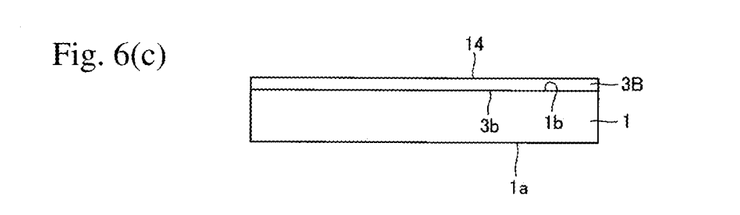
Figure 7A:
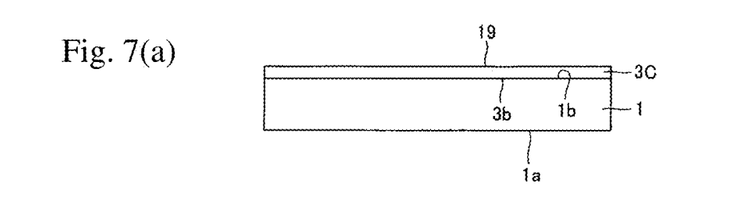
FIGS. 7(a), (b) and (c) are views for illustrating the process for manufacturing the element of the present invention.
Figure 7B:
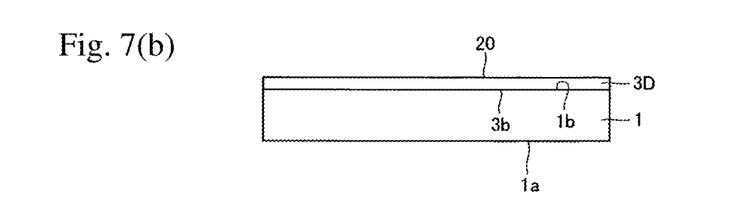
Figure 7C:
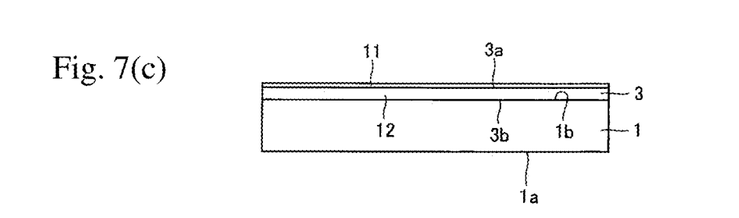

FIGS. 6 and 7 are sectional views schematically showing a manufacturing process of an assembly for acoustic wave element. In this example, the support substrate is directly bonded to the propagation substrate.

As shown in FIG. 6(a), a bonding face 1b of a support substrate 1 is opposed to a bonding face 3b of a propagation substrate material 3A. The bonding face 1b of the support substrate 1 and the bonding face 3b of the propagation substrate material 3A are subjected to activation treatment respectively. As the activation treatment, it is preferred to expose the substrate surface with neutralized Ar fast atom beam (FAB) or Ar ion beam within a high-vacuum chamber.

As shown in FIG. 6(b), the bonding face 1b of the support substrate 1 is then brought into contact with the bonding face 3b of the propagation substrate material 3A, and the both are directly bonded to each other by applying a pressure in a direction vertical to the bonding faces. The direct bonding is preferably performed as follows.

Namely, the activated substrate surfaces are brought into contact with each other at ordinary temperature within the high-vacuum chamber, and a load is applied thereon. Thereafter, the resulting bonded body is taken out of the chamber, whereby the bonding is completed.

As shown in FIG. 6(c), a thin propagation substrate material 3B is then formed by cutting a surface 13 of the propagation substrate material 3A to reduce its thickness. The thickness of the propagation substrate material is reduced close to a final target thickness at this stage.

A propagation substrate material 3C having a polished surface 19 is formed, as shown in FIG. 7(a), by polishing a surface 14 of the propagation substrate material 3B. It is preferred to reduce the arithmetic average roughness Ra of the polished surface to 4 nm or less at this stage. The polishing is preferably performed as follows.

That is, a diamond slurry (average particle size 0.5 to 3 μm) is dripped onto a metal surface plate (Sn, Cu), and the surface plate is rotated. The surface of the substrate material is placed in contact with the metal surface plate, and polished while applying a pressure.

A propagation substrate material 3D having a mirror surface 20 is then formed, as shown in FIG. 7(b), by mirror-finishing the polished surface 19 of the propagation substrate material 3C. The mirror surface means a surface having an arithmetic average roughness Ra of 1 nm or less. Precision polishing therefor is preferably performed as follows.

Namely, a colloidal silica slurry (average particle size 20 to 80 nm) is dripped on an abrasive pad, and the pad is rotated. The surface of the substrate material has been placed in contact with the pad and polished while applying a pressure.

In general, the mirror-polished mirror surface 20 of the propagation substrate material has been finish-machined by rubbing with a soft pad. Even when a cross-section after such finish machining is imaged by TEM, no layer with the particular contrast difference is identified on the surface. As the soft pad, a suede pad has been generally used.

However, when the mirror-polished mirror surface 20 of the propagation substrate material 3D is finish-machined by rubbing with a hard pad, the propagation substrate 3, having the surface lattice distortion layer 11 formed on the surface 3a, is produced as shown in FIG. 7(c).

As such a hard pad, a polyurethane foam pad or a urethane-impregnated nonwoven fabric pad is preferably used. The urethane foam includes a prepolymer of urethane, a hardener and a foaming agent. From the viewpoint of water resistance or chemical resistance, ether-based urethane is used as the urethane resin, and diamine or the like is used as the hardener. The expansion ratio is set to 0.4 to 1.0 g/cm$^3$ depending on the intended use. An epoxy resin-made pad is also developed, in addition to the urethane resin ones.

The fiber types of nonwoven fabric in the nonwoven fabric pad mainly include rayon, nylon, polyester, acryl, and polypropylene. Such a nonwoven fabric is impregnated with urethane resin, whereby a mixed body of nonwoven fabric and polyurethane resin is formed.

The hard pad and the soft pad are generally sorted by Young's modulus, with the Young's modulus of the hard pad being 100 MPa or more, and that of the soft pad being about 1 to 10 MPa.

In the step of finish-machining the mirror surface by use of the hard pad, polishing is performed using a colloidal silica slurry similarly to the case of the soft pad.

Although the support substrate is directly bonded to the propagation substrate material in the example of FIGS. 6 and 7, the both can be bonded together through an adhesive layer.

The material of the organic adhesive layer for bonding the support substrate to the propagation substrate is preferably an acrylic resin or an epoxy resin, but is not limited thereto.

Examples of a method for forming the adhesive layer include printing and spin coating, without limitation thereto.

In a preferred embodiment, the thickness t of the organic adhesive layer is set to 0.1 µm or more and 1.0 µm or less. From the point of further improvement in the frequency temperature characteristics of the acoustic wave element, the thickness of the organic adhesive layer is preferred to be 0.1 µm or more, and also preferred to be 0.8 µm or less.

EXAMPLES

Example 1

A surface acoustic wave element 6A as shown in FIG. 1(b) and FIG. 3(a) was manufactured according to the manufacturing method shown in FIGS. 6 and 7.

As the support substrate 1, a single-crystal silicon substrate of 230 µm in thickness and 4 inches in diameter was used. The linear expansion coefficient in SAW-propagating direction X of the support substrate 1 is 3 ppm/° C. As the propagation substrate material 3A, a 36° Y-cut, X-propagation lithium tantalate substrate having SAW-propagating direction of X and a rotary Y-cut cutting angle was used. The linear expansion coefficient in the SAW-propagating direction X is 16 ppm/° C. The thickness of the propagation substrate material 3A was 230 µm.

The support substrate and the propagation substrate material were introduced into a vacuum chamber keeping a vacuum of $10^{-6}$ Pa digits, and held therein with the respective bonding faces being opposed to each other. The bonding face of the support substrate and the bonding face of the propagation substrate material were activated by exposing them to argon beam for 80 seconds, respectively, to remove an inert layer located on each bonding face. The bonding face of the support substrate was then brought into contact with the bonding face of the propagation substrate material, and a load of 1,200 kgf was applied thereto in a direction vertical to the bonding faces, whereby the both are directly bonded to each other.

After the resulting assembly was taken out of the chamber, the surface of the propagation substrate material was ground by a grinding machine to reduce the thickness of the propagation substrate material to 25 µm. The assembly was then set in a lapping device, and polished using diamond slurry (average particle size 1 µm) until the thickness of the propagation substrate material was reduced to 21 µm. The polished surface of the propagation substrate material was mirror-polished using a colloidal silica (average particle size 0.05 µm) by a CMP (chemical mechanical polishing) machine until the thickness was reduced to 20 µm. The center line average surface roughness Ra of the resulting mirror surface was 0.15 nm.

The formed mirror surface was finish-machined by rubbing with a urethane foam pad (hard pad). A cross-section of the resulting element was reduced in thickness by mechanical polishing and ion milling, and a transmission type electron micrograph thereof was picked up under the following conditions.
Device Model: HITACH H-9000UHR I
Magnification: 21,000 to 520,000
Measuring Condition: Accelerating voltage 300 kV
Observation method: Bright-field image, diffraction pattern, multiple wave interference image As a result, as shown in FIG. 5, a darker-appearing thin layer with the contrast difference was identified on the propagation substrate surface over a thickness of 3 nm at 100000-fold magnification or more. The magnification of the TEM image in FIG. 5 is 520000-fold magnification. The TEM image was then subjected to fast Fourier transform (FFT), whereby an FFT pattern was obtained. No spot caused by crystal defect was identified therein.

As shown in FIG. 5, a surface darker line portion, a brighter line portion and a lower dark line portion are arranged in this order from the upper end to the lower end. A region having a constant thickness is observed under the line portions. The thickness of the surface lattice distortion layer is defined as a dimension from the upper end of the surface darker line portion to the lower end of the lower dark line portion.

A metal aluminum-made input electrode 4 and output electrode 5 of 0.14 µm in thickness were formed on this propagation substrate. The ratio of electrode thickness t/acoustic wave wavelength λ is 7%. Frequency temperature characteristics (temperature coefficient of frequency) of the resulting surface acoustic wave element was −10 ppm/° C. as measured at the resonance point thereof. Further, the insertion loss was proved to be 7.3 dB.

Comparative Example 1

A propagation substrate was obtained without the fishing processing of rubbing the mirror surface of the propagation substrate with the urethane foam pad (hard pad) in the above-mentioned example. A photograph of the vicinity of the surface of the propagation substrate was taken by TEM to prove that no region or layer with the contrast difference was observed.

A metal aluminum-made input electrode 4 and output electrode 5 of 0.14 µm in thickness were formed on this propagation substrate. The ratio of electrode thickness t/elastic surface wave wavelength λ is 7%. The frequency temperature characteristics (Temperature Coefficient of Frequency) of the resulting surface acoustic wave element were −20 ppm/° C. as measured at the resonance point thereof. Further, the insertion loss was proved to be 10 dB.

Example 2

In the example 1 described above, instead of the urethane foam pad, a harder pad of non-woven cloth was used to perform the polishing for the finishing. It was taken a photograph by TEM in the vicinity of the surface of the thus obtained propagation substrate to prove that the thickness of the lattice distortion layer was 8 nm. Further, the three layers, having different contrasts, were observed in the surface region as the Example 1.

A metal aluminum-made input electrode 4 and output electrode 5 of 0.14 µm in thickness were formed on this propagation substrate. The ratio of electrode thickness t/elastic surface wave wavelength λ was 7%. The frequency temperature characteristics (Temperature Coefficient of Frequency) of the resulting surface acoustic wave element was as good as −13 ppm/° C. as measured at the resonance point thereof. The insertion loss was, however, proved to be 8 dB, which was lower. It is considered that the surface distortion layer is thicker and the acoustic wave was attenuated during the propagation.

Example 3

A bonded substrate was produced in the same manner as Example 1. However, instead of the above-mentioned silicon substrate, a sapphire substrate having the same thickness as the silicon substrate was used, as the support substrate. The frequency temperature characteristics at the resonance point were −18 ppm/° C. in this case.

Comparative Example 2

A bonded substrate was produced in the same manner as Example 3. However, the finish processing of rubbing the mirror surface of the propagation substrate was performed using a suede pad (soft pad), instead of using the above-mentioned urethane foam pad (hard pad). Consequently, a photograph of the vicinity of the surface of the resulting propagation substrate was taken by TEM to prove that no region or layer with the contrast difference was observed. The frequency temperature characteristics at the resonance point were −23 ppm/° C.

Example 4

A bonded substrate was produced in the same manner as Example 1, except that a 128° Y-cut X-propagation lithium niobate substrate having a SAW-propagating direction of X and a rotary Y-cut cutting angle was used, as the propagating substrate material. The linear expansion coefficient in the SAW-propagating direction X is 15.4 ppm/° C. The thickness of the propagation substrate material was 230 μm. As a result of the same TEM observation of a cross-section of the polished substrate, the thickness of the surface lattice distortion layer was 15 nm, which was larger than the thickness in the case using lithium tantalate. This is assumed to be attributable to the relatively small Young's modulus of the crystal material. Further, the three layers, having different contrasts, were observed in the surface region as the Example 1.

The frequency temperature characteristics of the resulting surface acoustic wave element was −58 ppm/° C. as measured at the resonance point thereof, in the same manner as Example 1.

Comparative Example 3

A bonded substrate was produced in the same manner as Example 4, provided that the finishing processing of rubbing the mirror surface of the propagation substrate was performed using a suede pad (soft pad), instead of using the urethane foam pad (hard pad). A photograph of the vicinity of the surface of the resulting propagation substrate was taken by TEM to prove that no region or layer with the contrast difference was observed. The frequency temperature characteristics at the resonance point were −65 ppm/° C.

Example 5

Although both of the substrates were directly bonded to each other in all of the above-mentioned examples, the substrates can be adhered to each other by use of an adhesive layer.

Concretely, an adhered body was obtained by applying a liquid acrylic adhesive onto the surface of the silicon substrate used in Example 1 by a spin coater, and bonding the lithium tantalate substrate used in Example 1 thereon. The adhered body was placed in an oven of about 150° C. to cure the adhesive. An acoustic wave element was produced through the same steps as in Example 1.

According to TEM observation, the thickness of the surface distortion layer was 3 nm, which was the same as in Example 1. Further, it was observed the three layers with the contrast differences as Example 1. The frequency temperature characteristics at the resonance point were −10 ppm/° C., that was the same in Example 1, and it was revealed that the effect of the surface lattice distortion layer does not depend on the bonding method.

Comparative Example 4

A bonded substrate was produced in the same manner as Example 5, provided that the finish processing of rubbing the mirror surface of the propagation substrate was performed using a suede pad (soft pad), instead of using the urethane foam pad (hard pad). Consequently, a photograph of the vicinity of the surface of the resulting propagation substrate was taken by TEM to prove that no region or layer with the contrast difference was observed. The frequency temperature characteristics at the resonance point were −20 ppm/° C.

The invention claimed is:

1. A composite substrate for an acoustic wave element: said acoustic wave element comprising a support substrate and a propagation substrate for propagating an acoustic wave, said propagation substrate being bonded to said support substrate and comprising a piezoelectric single crystal;
    wherein said propagation substrate comprises a bonding face to be bonded to said support substrate and a surface on the opposite side of said bonding face;
    wherein said propagation substrate comprises a surface lattice distortion layer on the side of said surface on the opposite side of said bonding face and in which crystal lattices of said piezoelectric single crystal are distorted; and
    wherein said surface lattice distortion layer has a thickness of 15 nm or smaller.

2. The composite substrate of claim 1, wherein said thickness of said surface lattice distortion layer is 3 nm or smaller.

3. The composite substrate of claim 1, wherein said surface lattice distortion layer comprises a plurality of layers observed by a transmittance type electron microscope.

4. The composite substrate of claim 1, wherein said acoustic wave comprises a surface acoustic wave, a Lamb wave-type acoustic wave or a bulk acoustic wave.

5. The composite substrate of claim 4, wherein said acoustic wave element comprises a surface acoustic wave filter or a resonator.

6. The composite substrate of claim 1, wherein said support substrate and said propagation substrate are bonded to each other directly or through an adhesive layer.

7. The composite substrate of claim 6, wherein said adhesive layer comprises an organic adhesive layer having a thickness of 0.1 to 1.0 μm.

8. The composite substrate of claim 1, wherein said piezoelectric single crystal is selected from the group consisting of single crystals of lithium niobate, lithium tantalate and lithium niobate-lithium tantalate solid solution.

9. The composite substrate of claim 1, wherein said support substrate comprises a material selected from the group consisting of silicon, sapphire, aluminum nitride sintered body, alumina, silicon carbide sintered body, silicon nitride sintered body, borosilicate glass and quartz glass.

10. The composite substrate of claim 1, wherein said propagation substrate has a thickness of 0.1 to 40 μm.

11. The composite substrate of claim 1, wherein said acoustic wave element comprises an electrode pattern provided on said propagation substrate.

12. The composite substrate of claim 11, wherein said acoustic wave element comprises a surface acoustic wave filter or a resonator.

* * * * *